United States Patent
Blomquist

[11] Patent Number: 6,061,239
[45] Date of Patent: May 9, 2000

[54] CAM-TYPE RETAINER CLIP FOR HEAT SINKS FOR ELECTRONIC INTEGRATED CIRCUITS

[75] Inventor: Michael L. Blomquist, Camarillo, Calif.

[73] Assignee: PSC Computer Products, Camarillo, Calif.

[21] Appl. No.: 08/896,296

[22] Filed: May 16, 1997

[51] Int. Cl.[7] .................................................. H05K 7/20
[52] U.S. Cl. ............................ 361/704; 24/296; 24/458; 165/80.3; 248/510; 257/727; 361/710
[58] Field of Search ............................ 24/453, 457, 458, 24/473, 625, 295, 296, 297; 411/352, 900, 516, 522; 174/16.3; 165/80.3, 185; 248/316.7, 505, 506, 510; 267/150, 158, 160; 257/707, 718, 719, 727; 361/703, 704, 707, 710, 715, 717–719

[56] References Cited

U.S. PATENT DOCUMENTS

| | | | |
|---|---|---|---|
| 4,716,494 | 12/1987 | Bright | 361/386 |
| 5,208,731 | 5/1993 | Blomquist | 361/386 |
| 5,371,652 | 12/1994 | Clemens | 361/704 |
| 5,448,449 | 9/1995 | Bright | 361/704 |
| 5,521,439 | 5/1996 | Casati | 361/710 |
| 5,542,468 | 8/1996 | Lin | 361/710 |
| 5,600,540 | 2/1997 | Blomquist | 361/704 |
| 5,602,719 | 2/1997 | Kinion | 361/710 |
| 5,818,695 | 10/1998 | Olson | 361/719 |

OTHER PUBLICATIONS

Intricast advertisement for "The Clincher Series—Removable Heat Sink System for Surface Mount Devices".

*Primary Examiner*—Gerald Tolin
*Attorney, Agent, or Firm*—Andrea L. Mays

[57] ABSTRACT

A heat sink assembly comprises a heat sink and a retainer clip for attachment to an electronic package or semiconductor device so as to dissipate heat from such device. The heat sink may comprise a flat base with a plurality of upwardly extending fins. The fins will define at least one channel. The retainer clip includes two parts. One part is an elongated, resilient, metal strap that has holding means at each end for engaging a semiconductor socket, or a semiconductor module, so as to secure the retainer clip and heat sink to the device or module. The retainer clip also includes a cam-type latch which is pivotally positioned in the middle of the elongated strap and includes an arm and a cam. The cam has a bearing surface which is spaced from the axis of the elongated member a distance greater than the distance between the elongated member and the upper surface of the heat sink base when in the initially assembled position. When the arm is rotated, the bearing surface of the cam is forced against the upper surface of the heat sink which causes the strap to be displaced upwardly placing pressure on the strap and thereby forcing the heat sink into heat conducting engagement with the electronic device or module.

11 Claims, 5 Drawing Sheets

CAM-TYPE RETAINER CLIP FOR HEAT SINKS FOR ELECTRONIC INTEGRATED CIRCUITS

BACKGROUND OF THE INVENTION

1. Field of the Invention (Technical Field)

This invention relates to cooling of electronic assemblies.

Since the successful introduction of integrated circuits (ICs), there has been a steady progression toward larger IC devices to permit inclusion of a greater number of functions on the IC. The result is that the heat produced by these larger semiconductor devices is not adequately removed by either natural air convection nor by powered ventilation, such as a fan.

Convection cooling is performed by use of a heat sink that is directly applied to the semiconductor device. It is not desirable to use a bonding process, such as an adhesive, because of the permanent nature of such attachment; a semiconductor device may be discarded if malfunctioning and it is not desirable to throw away the heat sink too. It has therefore been found desirable to attach the heat sink to the chip or device by mechanical means such as a retainer clip. The typical heat sink currently in use comprises a flat plate generally the same size as the device, with a plurality of radiation tins extending upwardly. The heat sink is commonly fabricated from aluminum and is extruded and subsequently machined.

A new development in the electronic assembly art particularly for microprocessor semiconductor devices, utilizes a cartridge which contains a printed circuit board on which the microprocessor is mounted. The cartridge may be formed of plastic except for one major surface which may be constructed of metal so as to provide a thermal interface or plate for attachment of a heat sink. At least one major microprocessor supplier, Intel, has established a specification for the cartridge including the thermal plate. To facilitate the proper attachment of the heat sink to the cartridge thermal plate, the thermal plate is provided with multiple openings to permit the engagement of a heat sink retaining clip, or multiple clips.

The present invention will be described in its preferred embodiment in connection with the above-described microprocessor cartridge. However, it should be understood that the heat sink assembly, i.e. the heat sink and retainer clip, may also be used directly with a semiconductor device mounted directly on a printed circuit board or a socket.

2. Background and Prior Art

A wide variety of heat sink assemblies and retainer clips are available in the prior art. For example, the applicant's earlier U.S. Pat. No. 5,600,540 shows a heat sink and retainer for electronic integrated circuits comprising a two-piece retainer clip particularly adapted for use in connection with a semiconductor device mounted directly on a socket which in turn is attached to a printed circuit board. Another device is shown in applicant's earlier U.S. Pat. No. 5,208,731 which is a single-piece retainer clip for a similar chip, socket, and heat sink assembly. Other devices are shown in Bright U.S. Pat. Nos. 5,448,449 and 4,716,494 the former showing both one or two piece retainer clips for securing a heat sink to a semiconductor chip which is mounted in a socket and the latter showing a similar assembly with a different type of heat sink. Other prior art includes Clemens U.S. Pat. No. 5,371,652 which shows several types of retainer clips for attaching a heat sink directly to a semiconductor chip.

In all of the above-described devices, a common problem is the cost of the retainer clip and, much more importantly, the labor required to properly attach the retainer clip to secure the heat sink to the semiconductor chip and/or socket. It must be understood that when a semiconductor device such as a microprocessor is used in a personal computer, literally millions of chips, sockets, heat sinks, and retainer clips are used in these ubiquitous products. Thus, the time in which it takes to properly secure the heat sink in position and to attach it to the semiconductor device or socket becomes a critical consideration in the cost-effectiveness of a retainer clip. Other problems include design of a retainer clip so that there is a positive and easily recognized proper engagement of the retainer clip. If the means for attaching the retainer clip to the socket and/or chip is not positive in a sense that a retainer clip can only be attached or detached, with no middle ground, the assembly may not be attached yet that may not be noticeable to the technician or assembler performing that operation. The result is that when the computer or other electronic device is shipped, and is subjected to various forces, shaking, vibration, and other environmental shipping conditions the retainer clip may be unloosed with the result that the heat sink becomes disengaged and can ruin other components within the electronic device as the device is continued to be roughly handled in shipping. Even if other components are not damaged, with the heat sink dislodged, there being little likelihood that the user will be aware of such problem, the semiconductor device can be easily overheated and damaged or destroyed.

Still another problem with prior art devices is the cost of the retainer clip itself. Many proposed prior art devices require complex machining operations which greatly increase the price of the clip. It is highly desirable to make the clip using only the simplest metal forming devices such as a stamping machine. Wires are particularly unsuitable for the construction of retainer clips; although they are simple in appearance, the bending and forming of wire is a more complex and expensive forming operation than simple stamping. Other prior art devices use molded plastic and/or metal parts that must be cast or forged which again are more expensive metal forming operations.

Another problem with prior art retainer clips again relates to the rough handling that occurs during shipping of electronic devices which contain a semiconductor device, heat sink and retainer clip. It is of course desirable in all retainer clips that a relatively uniform and large pressure be applied to the heat sink so that the lower flat base surface is in intimate heat-conducting engagement with the upper surface of the chip, or with the module plate (see above). This pressure creates a frictional engagement between these two surfaces. However, with a sharp blow in the plane of the surfaces, such as the acceleration that may be experienced during some sudden starting or stopping of the electronic device in which this assembly is contained, the heat sink may slide relative to the chip and then strike the retainer clip holding means so as to dislodge the clip and again allowing the heat sink to be separated from the chip and heat sink assembly. Even partial movement of the heat sink base relative to the semiconductor device so that the heat sink is still in engagement with the semiconductor device but is displaced will affect the efficiency of the heat transfer from the device to the heat sink.

SUMMARY OF THE INVENTION (DISCLOSURE OF THE INVENTION)

The present invention comprises a heat sink assembly including a heat sink and a heat sink retainer clip. The heat sink assembly is mounted to a semiconductor device or module or housing containing the device used in electronic equipment, such as a computer, so as to provide cooling of the device. The heat sink comprises a base which may be approximately the same size as the upper surface of the semiconductor device or, in the case of a module, the metal plate forming the upper surface of the module. On the base of the heat sink there is provided a plurality of cooling fins which may be integral with the base plate of the heat sink and which define at least one channel for receiving the retainer clip. The retainer clip includes two parts one of which is an elongated, resilient, metal strap that is positioned in the channel of the heat sink and which includes at each end holding means engaging lugs on a socket or openings in a module. The strap has a length so that when initially placed in the channel so that each of the holding means is in approximate position to the corresponding means (lug, opening, etc.) on the socket or module, the center portion of the strap is spaced a predetermined distance above the upper surface of the base. The strap is not in tension. The retainer clip also includes a cam-type latch pivotally mounted in the center portion of the strap and including a cam with a bearing surface at the outer end and an arm fixedly mounted to the cam. The distance from the pivot axis to the bearing surface of the cam is greater than the distance between the pivot axis and the upper surface of the base of the heat sink when the strap is initially placed in the channel and is not in tension. When the arm is rotated it causes the cam to bear against the surface of the base of the heat sink placing the strap in tension so as to force the heat sink into heat conducting engagement with the module or semiconductor device.

It is an object of the present invention to overcome the above stated difficulties of the prior art devices so as to provide a retainer clip and heat sink assembly which is low in cost, easy to assemble, has substantial assembly integrity, is relatively impervious to adverse environmental conditions affecting the electronic device in which the heat sink assembly is used, and is inexpensive to fabricate.

DESCRIPTION OF THE PREFERRED EMBODIMENTS

Figure 1:
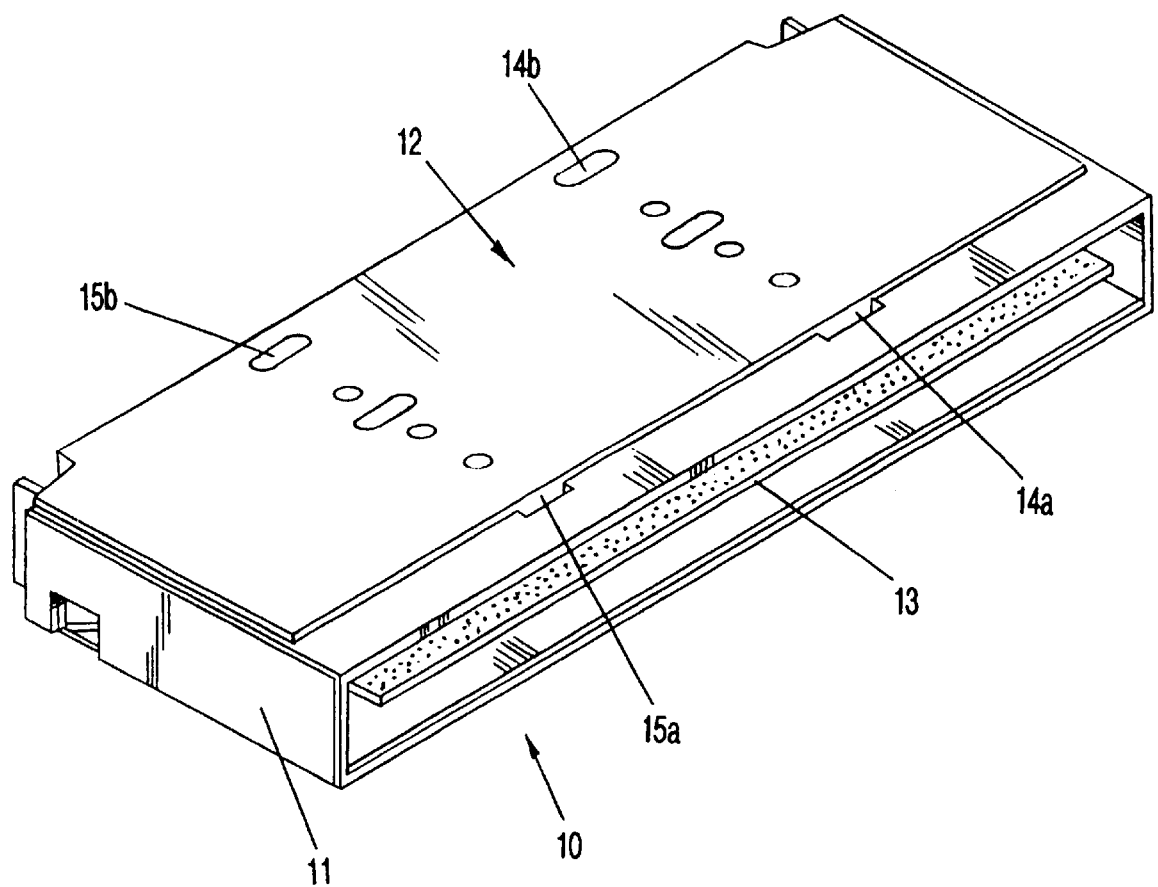
FIG. 1 is a perspective view of a module containing one or more semiconductor devices.

The first embodiment of the present invention will be shown and described in conjunction with a semiconductor module 10 which has a case 11 including a wall 12 defining the upper surface of case 11. The module is merely representative of a housing that contains at least one semiconductor device; the term "housing" includes modules, cartridges, the semiconductor device itself, or the semiconductor device mounted in a socket. Within the module is mounted a printed circuit board 13 which may include one or more semiconductor devices (not shown). A portion of the upper major wall 12 is made of metal or other high heat-conducting material and is intended to engage or interface with a heat sink for dissipating heat from the semiconductor devices and the module as a whole. To assist in the engagement of a heat sink to the wall 12, the major wall 12 is provided with a plurality of openings shown at 14 and 15. In the particular module configuration shown, two holes 14A, 15a are adjacent one longitudinal edge and two holes 14b, 15b are adjacent a second longitudinal edge of the module.

Figure 2:
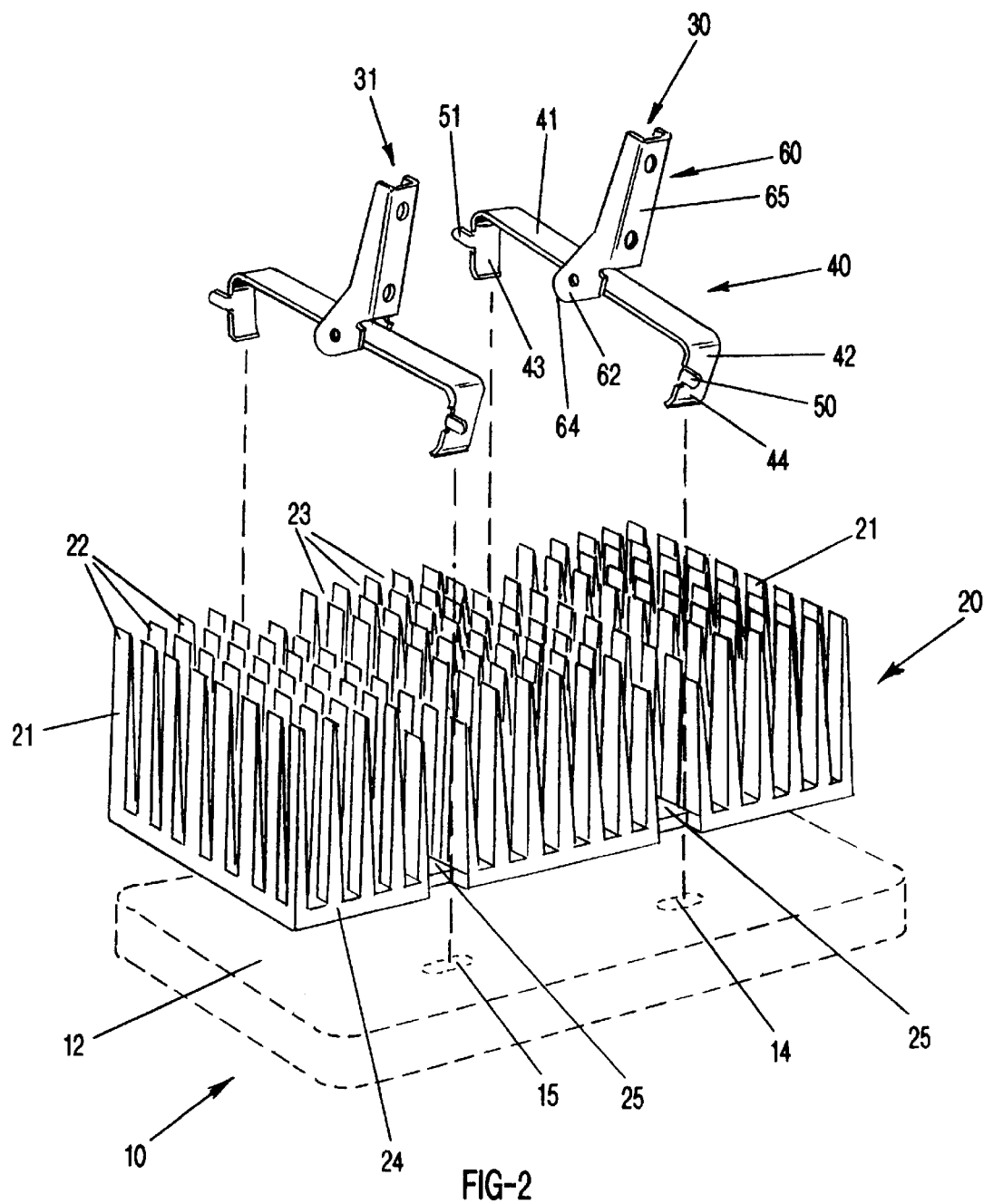
FIG. 2 is a perspective view showing the module, a suitable heat sink, and the retainer clip of the present invention in disassembled condition.
Figure 3:
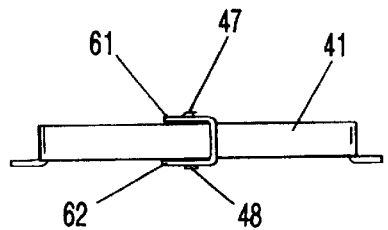
FIG. 3 is a top view of the retainer clip.
Figure 4:
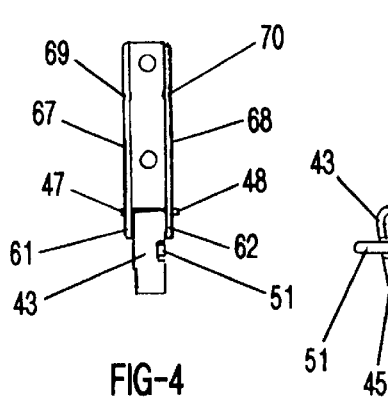
FIG. 4 is a side view of the retainer clip with the over-center latch in the raised position.

As seen in FIG. 2, the module is designed to engage with a heat sink, a typical and merely exemplary type of heat sink being shown generally at 20. The heat sink 20 has a plurality of fins 21 comprising a series of rows. The rows in turn define a series of channels 23 running transversely across the heat sink 20. The fins may be permanently attached to a base 24 of the heat sink 20, and as is common. the fins 21 and base 24 may all be extruded as a single unit. In the particular heat sink configuration adapted for use with the module 10, a wider channel 25 may be positioned at one or more locations depending upon the length of the heat sink 20, These wider channels 25 are aligned with one pair of holes such as holes 14a and 15a. As seen in FIG. 2, the base 24 of the heat sink is generally rectangular and is substantially the same size as the wall 12 of module 10 so as to maximize the efficiency of the heat transfer between wall 12 and heat sink 20.

The retainer clips are shown at 30 and 31, one of which will be described in detail, since both are identical in construction, function and operation. As will be seen in FIG. 2, the two retainer clips 30 and 31 are designed to be positioned in the channels 25 of the heat sink 20 and as will be later explained, are designed so as to secure the heat sink 20 to the module 10 as well as to force into heat conductive engagement the bottom surface of the base 24 of heat sink 20 and the metal surface of the wall 12 of module 10.

The retainer clip will now be described in more detail, in this first embodiment, and reference may be made to FIGS. 2–7 for this purpose. Generally, the retainer clip 30 comprises a metallic strap shown generally at 40 and a cam-type latch shown generally at 60.

The elongated strap 40 is made of a resilient metal such as stainless steel although other resilient materials may be suitable for the strap. Each strap has a relatively flat center portion 41 and is bent at each end to form two legs or depending members, 42 and 43. The lower ends of the legs 42 and 43 are each provided with holding means such as hook portions 44 and 45 for engaging the holes 14, 15 in the module 10. In this first embodiment, the engaging, holding or attaching means each comprise a bent tip or hook adapted to engage the underside of the module wall after extending through the openings 14, 15 in a manner described below.

Figure 5:
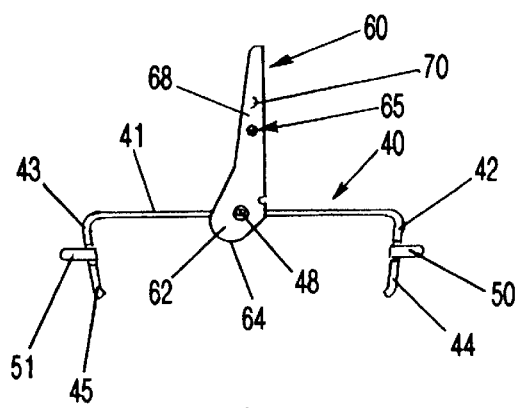
FIG. 5 is a side view of the retainer clip of the present invention.
Figure 6:
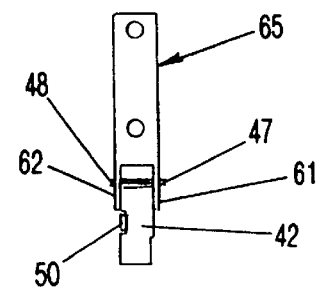
FIG. 6 is the opposite side view of the retainer clip.
Figure 7:
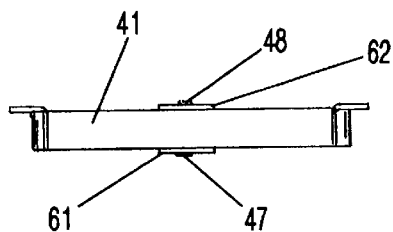
FIG. 7 is a bottom view of the retainer clip.

As seen best in FIG. 5, each of the legs 42 and 43 of the strap 40 include a tab 50, 51 which prevents the legs 42, 43 from being inserted through the holes 14 to the point where the edge of the leg might touch the printed circuit board 13 or any sensitive electronic devices mounted on the circuit board.

The cam-type latch 60 is pivotally mounted in the center portion of the strap 40 on pivot arms or stub axles 47, 48 which may be integrally formed as part of the center portion 41 of strap 40. The latch body is formed by stamping so as to form a channel cross-section including a pair of legs 61, 62 defining a cam which has bearing edge 64.

Cam-type latch 60 also includes an arm 65 which is integrally formed with the cam, 61, 62. Arm 65 as seen in FIG. 5 is shown in the raised position representative of the retainer latch in the relaxed or initially placed position. The arm 65 is also of channel construction and has two extensions, 67 and 68. In addition, as seen best in FIG. 4, the extension 67 and 68 each have a slight indentation or dimple 69, 70 for latching or securing the cam-type latch 60 in the engaged position as more fully described below.

Figure 8:
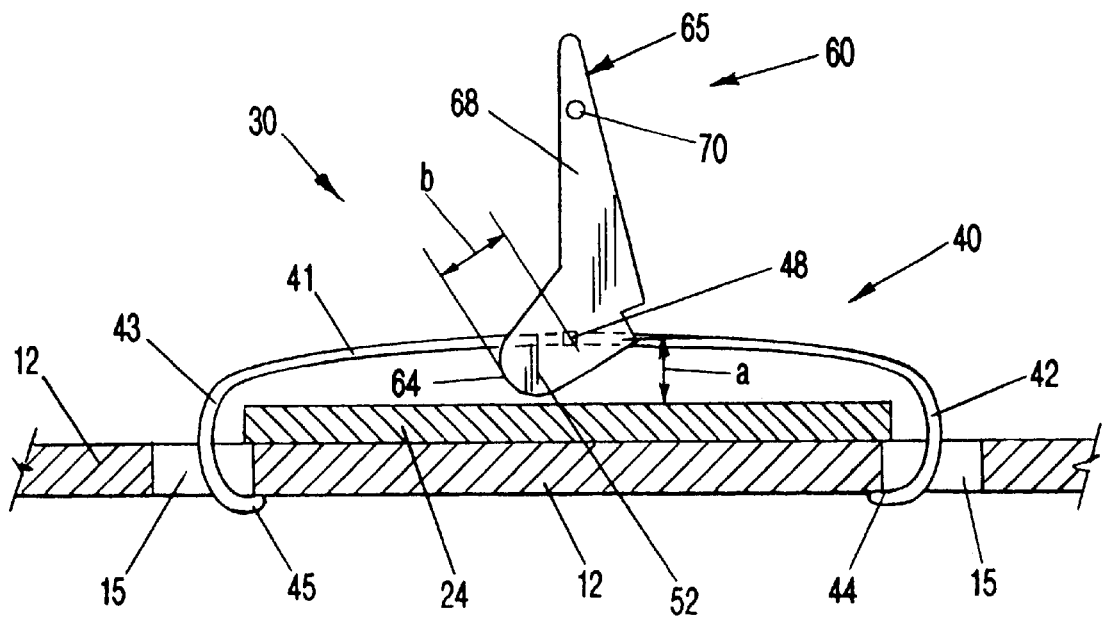
FIG. 8 is an enlarged view of the retainer clip, heat sink base, and module in the initially placed position.
Figure 9:
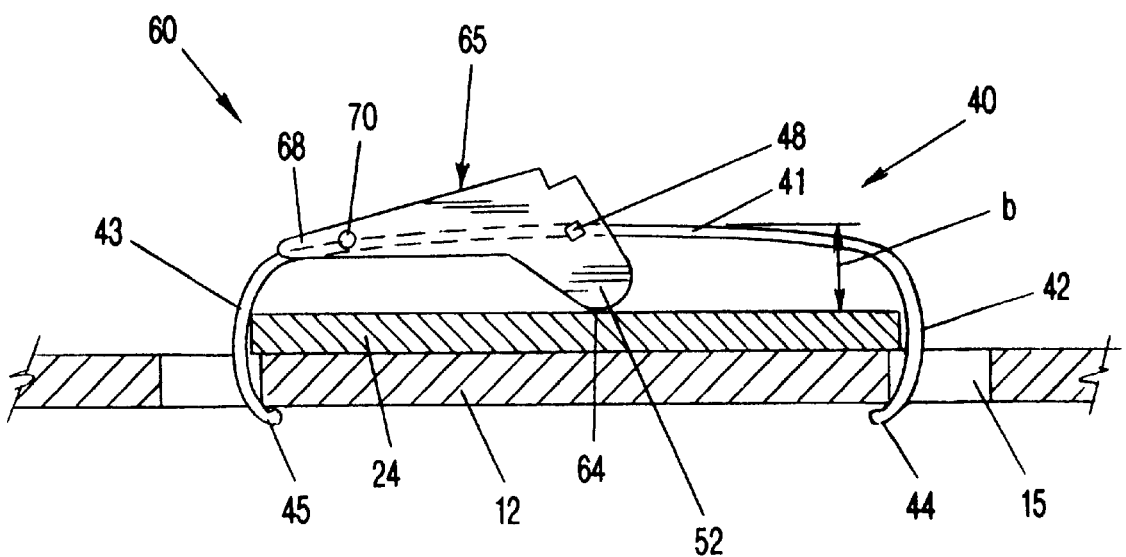
FIG. 9 is the same as FIG. 8 but showing the retainer clip in the engaged position.

The dimensions of the retainer clip 30, relative to the thickness of the base 24, and module wall 12, including the length of the legs 42, 43 of strap 40, as well as the resiliency of the material used to form the strap, are all important in achieving the objective of the invention. As will be seen in FIG. 8, when in the relaxed or initial position i.e., the metallic strap legs 42, 43 have been positioned so as to depend through the holes 15 in the module wall 12, the distance "a" from the upper surface of the heat sink base 24 to the axis of the pivot axle 48 is less than the distance "b" from the axis to the bearing surface 64 on cam 61, 62. As will be seen in FIG. 9, when the arm 65 is rotated, counterclockwise as shown in FIGS. 8 and 9, such as when a technician presses on the upper surface of arm 65, the bearing surface 64 on the cam 61, 62, engages the upper surface of the heat sink base 24. As the rotation continues, the cam forces the center portion 41 of the strap 40 upward while simultaneously the legs 42 and 43 are drawn toward one another so as to clamp the heat sink base 24 between the legs 42 and 43. The result as seen in FIG. 9 is that the heat sink base 24 is both biased into heat conductive engagement with wall 12 while simultaneously trapping the base 24 between the legs 42 and 43. As seen in FIG. 9, the upper edge of the base 24 at both ends is engaged with the inner surface of the legs 42 and 43 to perform the trapping. As the arm is pressed into final engaged position the detent 70 snaps below the strap portion 41 so as to hold the entire latch in the fully engaged position as shown in FIG. 9. Consequently, it will be seen that because the distance "b" is greater than the distance "a" when the cam-type latch 60 is in the initial position as shown in FIG. 8, the strap 40 while engaged within the holes 14a, 15a is relatively loosely engaged until the heat sink is properly centered on wall 12 whereupon the assembler or technician locks the heat sink in place on the module by depressing arm 65.

Figure 10:
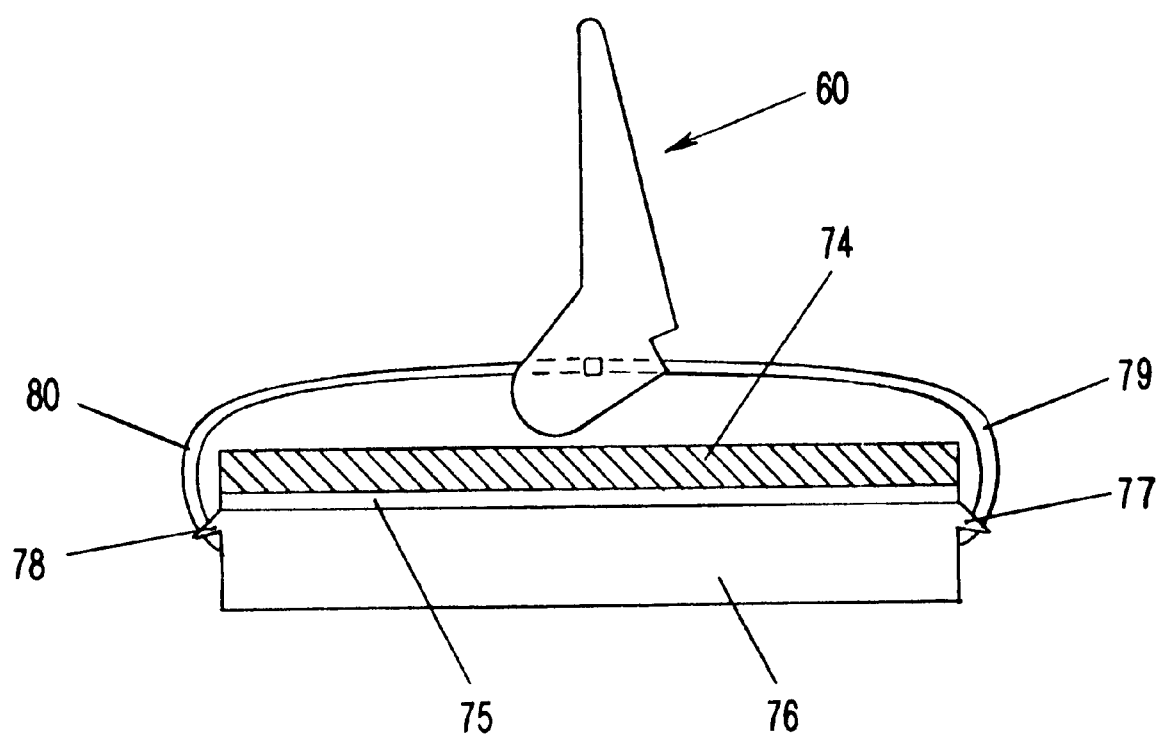
FIG. 10 is a second embodiment of a retainer clip constructed in accordance with the present invention shown in the initially placed position.

Referring now to FIG. 10. it will be seen that the cam-type retainer clip of the present invention may be made to cooperate with other types of semiconductor devices, modules, sockets, or other housings used in the industry for mounting a semiconductor device. In the configuration shown in FIG. 10, there is a heat sink base 74, a semiconductor device 75, and a socket 76 having a pair of ears or lugs 77, 78. The cam-type retainer clip is formed with an elongated strap and a latch, the latter being identical in this embodiment to the earlier embodiment described. In this embodiment, the strap legs 79, 80 have openings which are inserted over-the lugs 77, 78 to thereby create holding means for engaging the strap with the socket 76. As in the previously described embodiment, when the latch arm 60 is rotated, for the reasons as above-described, the strap is placed in tension and the legs 79 and 80 are drawn toward one another while the center portion of the strap is raised thereby placing pressure upon the heat sink base 74 against the upper surface of the semiconductor device 75 while simultaneously trapping the base 74 between the legs 79 and 80.

Other embodiments of the invention described above will be apparent to those having ordinary skill in the art and the above-described invention is limited not by the embodiments described but only by the appended claims.

What is claimed is:

1. In a heat sink assembly providing cooling to an electronic semiconductor device wherein the device is mounted in a module, the module having means for engagement with a retainer clip, and the heat sink having a generally flat bottom surface and heat conducting engagement with the semiconductor device upper surface and a plurality of fins on the upper surface defining at least one channel, the improvement comprising a heat sink retainer clip including:

an elongated, resilient metal strap received in one of the channels of the heat sink having holding means at each end engaging the engagement means on the module, the center portion of the strap spaced a pre-determined distance above the upper surface of the heat sink base when the strap is not in tension; and a cam-type latch pivotally mounted in the center portion of the strap and including a cam with a bearing surface, the distance from the pivot access to the bearing surface of the cam being greater than the distance between the pivot access and the upper surface of the base of the heat sink when said strap is not in tension, and an arm fixedly mounted to said cam, said arm, when rotated, causing said bearing surface of said cam to be forced against the surface of the base of the heat sink placing the strap in tension so as to force the heat sink into heat conducting engagement with the module.

2. The improved retainer clip set forth in claim 1 when said cam-type latch comprises a single piece of metal stamped to form a channel.

3. The improved retainer clip of claim 2 wherein said latch arm includes means for retaining the arm in engagement with the strap so that tension is applied to the strap.

4. The improved retainer clip of claim 3 wherein said strap is provided in the center portion with stub axles projecting laterally outward, said cam-type latch having an opening in each wall of the channel midway between the arm and cam and receiving the stub axles so as to pivotally mount the latch on the elongated strap.

5. A heat sink assembly including a heat sink and a spring retainer clip providing cooling to an electronic integrated circuit device, the device being mounted in a housing, such as a socket or a module, the housing having engagement means for the spring retainer clip, said heat sink assembly comprising:

a heat sink including a metallic plate with a plurality of fins projecting upwardly from the top surface of the plate defining a series of channels; and such spring retainer clip comprising two members:

an elongated, resilient metal strap received in one of said channels and holding means at each end of said strap engaging the engagement means on the housing, said strap having a length such that when it is in engagement with the housing, the center portion of the strap is spaced a pre-determined distance above the upper surface of the heat sink base when the strap is not in tension; and a cam-type latch pivotally mounted in the center portion of the strap and including a cam with a bearing surface, the distance from the pivot access to the bearing surface being greater than the distance between the pivot access and the upper surface of the base of the heat sink when said strap is not in tension, and an arm fixedly mounted to said cam, said arm when rotated causing said cam to bear against the surface of the base of the heat sink placing the strap in tension so as to force the heat sink into heat conducting engagement with the housing.

6. The heat sink assembly of claim 5 wherein when said arm is rotated, placing the strap in tension, the inner surfaces of the strap adjacent the edge of the housing traps said heat sink to prevent inadvertent lateral movement.

7. A combination heat sink and heat sink retainer clip, for attachment to a rectangular electronic module wherein the rectangular electronic module contains a printed circuit board and at least one semiconductor device, has at least one major wall which is substantially flat and made of a heat conducting material such as metal, and includes at least two spaced apart openings each adjacent one of the longer edges of the wall, said heat sink having a rectangular base substantially the same size as the electronic module major wall and a plurality of cooling fins defining at least one channel, said at least one channel aligned transversely between the at least two spaced apart openings in the electronic module wall; and said retainer clip comprising:

an elongated, resilient, metal strap received in said at least one channel and holding means at each end engaging one of the openings in the module wall, said strap having a length such that with each end in engagement with one of the module wall openings, the center portion of the strap is spaced a predetermined distance above the upper surface of the heat sink base when the strap is not in tension; and a cam-type latch is pivotally mounted in the center portion of the strap and including a cam with a bearing surface, the distance from the pivot axis to the cam bearing surface being greater than the distance between the pivot axis and the upper surface of the base of the heat sink when said strap is not in tension, and an arm fixedly mounted to said cam, said arm when rotated causing said cam to bear against the surface of the base of the heat sink and placing the strap in tension so as to force the heat sink into heat conducting engagement with the module wall.

8. The assembly of claim 1 wherein said strap holding means comprises hook-shaped portions at each free end of the strap, the hook-shaped portions being received in the module wall openings to engage the lower surface of the module wall adjacent the opening when the strap is placed in tension.

9. The heat sink assembly of claim 1 wherein said strap is of generally rectangular configuration and is formed by stamping.

10. The heat sink assembly of claim 1 wherein said cam-type latch comprises a single piece of metal formed into a channel, said center portion of the strap is provided with transversely projecting tabs defining a pivot axle, the latch having openings receiving the tab axles, said cam-type latch being formed by a stamping operation.

11. The heat sink assembly of claim 10 wherein the arm of said cam-type latch includes detent means for retaining the latch arm in the fully engaged position to prevent inadvertent pivoting of the arm into a relaxed position.

* * * * *